July 6, 1965 J. CUSTER 3,193,316

INSERTION AND EXTRACTION TOOL

Filed Feb. 26, 1963

INVENTOR
JAMES CUSTER

BY J. P. Santo
ATTORNEY.

United States Patent Office 3,193,316
Patented July 6, 1965

3,193,316

INSERTION AND EXTRACTION TOOL

James Custer, Allen Park, Mich., assignor to Burroughs Corporation, Detroit, Mich., a corporation of Michigan Filed Feb. 26, 1963, Ser. No. 260,990
6 Claims. (Cl. 294—33)

This invention relates generally to printed circuit board handling tools and, more particularly, to a tool specially suited for extracting or inserting plug type electrical components, such as printed circuit boards, from or in relatively densely packed, electrical connector mountings.

It is an object of this invention to provide a handling tool readily attachable to and detachable from plug-in electrical circuit boards for extraction or insertion of such boards from or in closely confined mountings and surroundings.

Another object is to provide a readily actuable and deactuable handling tool which furnishes a secure, positive grip or lock on a printed circuit board upon engagement therewith preparatory to and during extraction or insertion of the board in relatively closely defined mountings while allowing complete freedom of manipulation of the board in any position of the tool and board without dislocation or disconnection of the tool from the board and hazarding the risk of dropping or damaging it during such manipulation.

Another object is to provide a tool for handling printed circuit boards on which translational pulling or pushing forces may be exerted on the board through the tool in the direction of the desired force translation.

Another object is to provide a compact, efficient inexpensive tool of the above character and which is of simple, unitary, one-piece construction, and is suited for convenient one-hand operation.

Other objects and advantages, together with the construction and operation, of the structure of this invention will be apparent from the following specification and drawings wherein.

Figure 1:
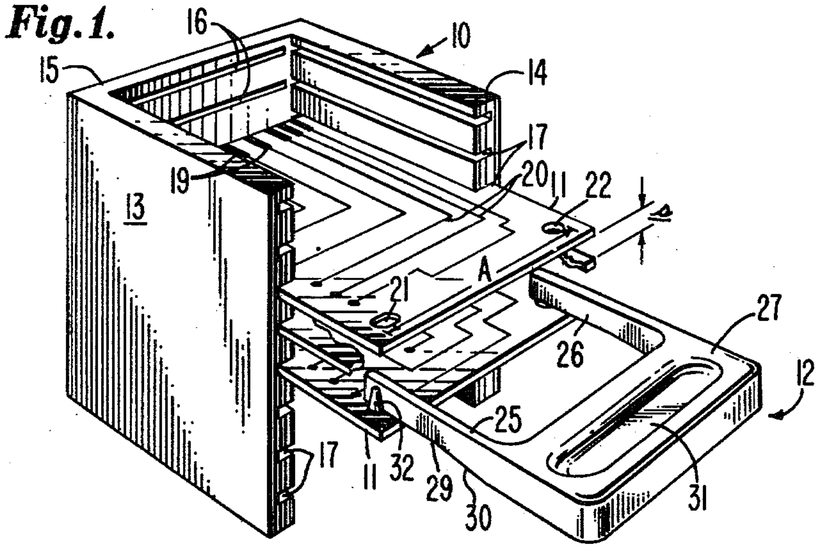
FIG. 1 is an isometric view of a printed circuit board mounting apparatus including a tool in accordance with the present invention.

Referring to the drawings, FIG. 1 illustrates a guide and connector rack structure 10 for mounting a plurality of printed circuit cards, as 11, which are adapted to be inserted in or extracted from the rack structure by the tool 12 in accordance with the present invention.

While forming no part of the present invention the guide and connector structure briefly described may comprise a spaced pair of side walls 13, 14 joined by an end wall 15 having a plurality of vertically spaced, laterally extending horizontal grooves 16 therein aligned with vertically spaced, longitudinally extending horizontal guide forming grooves 17 in the side walls 13, 14. The grooves 16 contain electrical connector pins or contacts for making electrical contact and connection with electrical terminal pads 19 which are located adjacent one end of and are connected with printed circuit conductors 20 on the printed circuit boards 11.

In addition to the printed circuit conductor pattern, the boards, which are composed of thin phenolic or other insulating material, customarily carry various passive and dynamic electrical components mounted thereon and electrically connected to various ones of the printed circuit conductors. The boards are shown as being of generally elongated rectangular configuration and as containing a spaced pair of apertures 21, 22 adjacent the sides and near the end of the board opposite the terminals 19. The longitudinal edges or opposite sides of the boards are received in a vertically aligned pair of longitudinally extending horizontal grooves 17 in opposite side walls 13, 14 of the mounting structure which provide a guideway or track for insertion and removal of the individual boards and a mounting support therefor when the boards are positioned in the guide and connector structure. The apertures 21, 22 are locating holes which are provided in the boards during the fabrication, machining and processing thereof, the aperture 21 being shown as somewhat elongated.

The aforementioned holes are adapted to cooperate with the tool 12 which comprises a generally U-shaped structure of unitary, one-piece construction molded of suitable insulating plastic material, such as nylon. The tool comprises a spaced pair of generally parallel, narrow elongated finger portions 25, 26 bridged near one end by a thickened handle or palm portion 27. The laterally spaced fingers located at the opposite ends and extending transversely of the handle portion, have a substantially flat board contacting surface portion 29 and an intermediate transition section 30 of increasing cross section toward the handle portion, which is centrally longitudinally recessed or embossed in both surfaces as shown at 31 providing a reduction of plastic material in the tool without substantially reducing the stress capacity of the handle.

Figure 5:
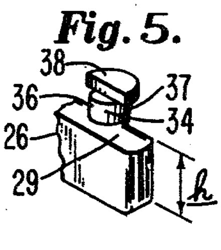
FIGS. 5 and 6 are enlarged isometric views showing details of configuration of a part of the tool.
Figure 6:
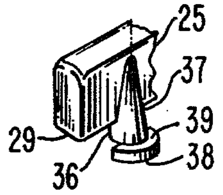
Figure 7:
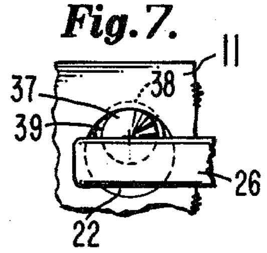
FIGS. 7 and 8 are an enlarged fragmentary top plan and isometric view, respectively, of a part of the tool cooperating with a board.
Figure 8:
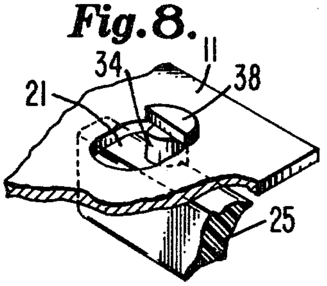
Figure 4:
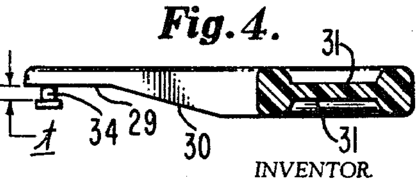
FIG. 4 is a sectional view taken in the plane 4—4 of FIG. 2.
Figure 3:
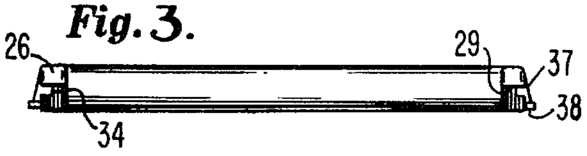
FIG. 3 is an end view of FIG. 2.

Adjacent the end of each of the finger portions opposite the handle portion is an integrally molded peg-like projection or protuberance 32, 33 projecting normally from and axially located off-centrally of the flat face portion 29. The peg projections, which are of compound geometrical configuration, may be described with reference to FIGS. 5, 6 and 8 as comprising an intermediate shaft like portion 34, which has a substantially cylindrical surface 36 facing inwardly of the fingers, a right conical camming surface 37 facing outwardly of the fingers, and an extended cap or ledge portion 38 serving as a catch. Catch 38 has a land or board seating surface portion 39 which is adapted to seat on the surface of the board opposite the surface contacted by the flat surface portion 29 of the finger. The land or board surface contacting portion of the cap 38 located at the base or distal end of the peg is spaced from the cooperating flat surface portion 29 of the finger by the distance "$t$" equal to the thickness of the board. For molding considerations, the extended cap or ledge 38 may be of semi-cylindrical configuration coaxial with and surrounding half of the shaft portion 34 with the common axis of the cylindrical and conical surface portions of the protuberances contained in the plane of the outer edge of the fingers as shown in FIG. 7, enabling the provision of convenient draft angles thereon as well as on the recesses 31 in the handle portion to facilitate one-piece molding of the entire structure.

The outer radius of the ledge or cap portion 38 at the base of a protuberance is slightly less than the radius of the apertures 21, 22 in the card to enable insertion of the protuberance therethrough and to position the land 39 on the side of the board opposite the side of the board contacted by the flat face portion 29 of the finger. The land or seat 39 provides sufficient area in contact with the surface of the board to cooperate effectively with the flat portion of the finger and securely hold the board thereto, it being noted that both sides or surfaces of the card are engaged by the tool through the fingers and protuberances carried thereby.

Figure 2:
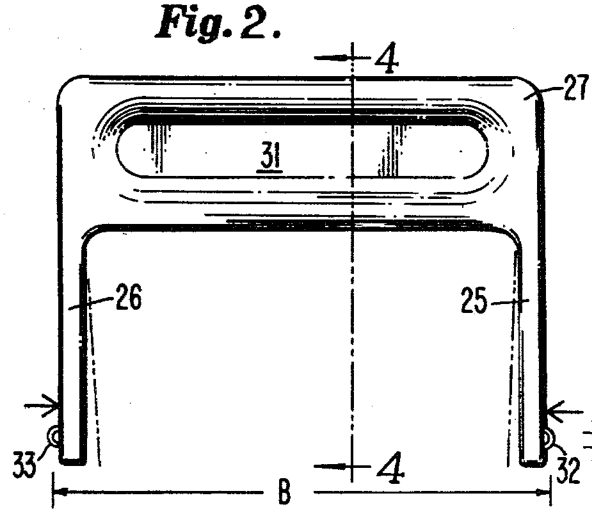
FIG. 2 is a plan view of the tool shown in FIG. 1.

The distance between the axial centers of the peg protuberances is slightly greater than the distance between the centers of the apertures in the card, or more exactly the linear distance B measured along a line passing diametrically through both pegs and from the base of the outer conical surface of one peg to that of the other is slightly greater than the distance A between the outermost portions of the walls or the maximum distance between the apertures. Thus, in order to insert the protuberances into the card apertures, it is first necessary to pinch the resiliently, deformable fingers of the tool inwardly near their ends in the indicated direction to deflect the fingers as shown by the dashed and dotted lines in FIG. 2. As the fingers are released, they attempt to spread and cause the outer conical surfaces 37 of the protuberances to cam against the walls of the apertures, thereby to force the adjacent surface of the board toward and into contact with the flat surface portion of the fingers. The ledge or collar portions of the protuberances, extending through the apertures, contact and catch on the other side of the board, thereby securely holding the board and gripping both surfaces of the board between the flat surface portion of the fingers and the seating portion 39 on the ledge or cap 38 to lock and prevent any transverse or longitudinal displacement of the board from and relative to the tool. The height or dimension "$h$" of the fingers is less than the spacing "$s$" between adjacent boards in the rack, enabling ready insertion of the tool between adjacent boards in closely or densely packed surroundings without skinning the fingers or injury to the hands of the operator. Since the pegs are surrounded by the walls of the apertures, the forces are applied to the board through or against the walls of the apertures bearing against the shafts of the pegs resulting in the application of positive and non-slipping forces thereto. After insertion or removal of the board, the tool may be readily detached therefrom simply by inwardly deflecting the spring-like fingers to release the cap portions 38 of the pegs or protuberances from the surface of the board and the walls of the apertures and withdrawing them from the apertures.

The tool and the board act effectively as an integral unit, the tool serving as a handled unitary extension of the board and enabling complete freedom of manipulation of the board which may be inverted or held in any position without risk of dropping it during such manipulation and without depending on any additional structure, such as any part of the connector guide or block, for securing or manipulation of the board. In its application as an insertion or extraction tool, it will be noted that the tool does not rely on pivotal, leverage or fulcrum forces but may be used as a puller or pusher tool to apply translational forces therethrough in the direction of the desired translation force.

What is claimed is:

1. A readily attachable and detachable tool for securely holding a printed circuit card having a laterally spaced pair of apertures adjacent opposite edges and near one end thereof during insertion and extraction of said card in a rack supporting a plurality of parallel, closely spaced printed circuit cards, said tool comprising a solid elongated palm-fitting handle portion having its length several times greater than its width and a pair of substantially parallel and resiliently deflectable fingers spaced longitudinally of and extending laterally from said handle portion, each of said fingers having a substantially flat surface near one end thereof bridging the gap formed by a corresponding one of said apertures and adapted to contact the flat surface on one side of said printed circuit card over an appreciable length of the fingers and a peg-like proturberance projecting normally from said flat surface of each of said fingers a distance at least equal to the thickness of the card and in a direction normal to the surface of the card, said protuberances being of lesser cross-sectional area than the apertures for reception in a respective one of the apertures in the card and being spaced apart a distance slightly greater than the corresponding distance between said apertures to provide a firm grip of the card by the protuberances against the walls of the apertures and said flat card contacting surfaces of said fingers upon inward deflection and subsequent release of the fingers for insertion of the protuberances in the apertures in the card.

2. A tool in accordance with claim 1 above wherein each of said protuberances has a lateral camming surface formed thereon cooperating with the wall of an aperture receiving the protuberance therein.

3. A tool in accordance with claim 1 above wherein said tool engages both surfaces of said card through said fingers and the protuberances carried thereby.

4. A tool in accordance with claim 1 above wherein each of said protuberances projecting through an aperture in the card has a flat ledge portion to engage the surface of the card opposite the surface of the card engaged by the flat surface portion of each of said fingers.

5. A tool in accordance with claim 4 above wherein the distance between the flat surface portion of a finger to the flat ledge on the protuberance carried by the finger is substantially equal to the thickness of the card.

6. A part handling tool for manipulating a broad, flat surfaced part having a pair of laterally spaced openings near one end thereof and extending therethrough from one surface of the part to the opposite other surface thereof, said tool comprising a handle and an elongated pair of resiliently deflectable fingers joined by the handle at the rearward extremity of the tool and laterally spaced apart at the forward extremity of the tool opposite the handle, each of said fingers having a first part-engaging portion extending forwardly of the tool, said first part-engaging portions being coplanar, a second part-engaging portion extending from the first part-engaging portion at an angle to the plane of the first part-engaging portion, a third part-engaging portion joined to the second part-engaging portion and extending in a direction laterally outwardly away from said first part-engaging portion at substantially right angles thereto in a plane parallel to the plane of the first part-engaging portion and spaced from said plane a distance approximately equal to the thickness of the distance between the said surfaces of the part, said second and third part-engaging portions being of lesser cross-sectional area and expanse than either of the openings and being spaced apart a distance measured from their juncture to the junction of the second and third part-engaging portions of the other finger that is slightly greater than the maximum distance between the openings in the part, and a fourth part-engaging portion contained in the same plane as the said first part-engaging portion and joined to and extending forwardly in the direction of the longitudinal extent of the finger beyond the said first, second, and third part-engaging portions thereon and past an opening in the part when the second and third part-engaging portions of each of the fingers are inserted in their corresponding openings upon inward deflection and subsequent release of the fingers, thereby to provide a firm grip and complete support of the part in any position thereof with the second part-engaging portion of a finger bearing against the walls of an opening, the third part-engaging portion bearing against the said opposite surface of the part, and the first and fourth part-engaging portions bearing against the said one surface of the part.

References Cited by the Examiner

UNITED STATES PATENTS 2,893,777 7/59 O'Neil et al. ---------- 294—1

FOREIGN PATENTS 266,700 7/27 Great Britain.

ROBERT B. REEVES, *Primary Examiner.*

LOUIS J. DEMBO, SAMUEL F. COLEMAN, *Examiners.*